US006965426B2

(12) United States Patent
Takashima

(10) Patent No.: US 6,965,426 B2
(45) Date of Patent: Nov. 15, 2005

(54) POSITIONING SYSTEM AND EXPOSURE APPARATUS HAVING THE SAME

(75) Inventor: Tsuneo Takashima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/694,083

(22) Filed: Oct. 28, 2003

(65) Prior Publication Data

US 2004/0145715 A1 Jul. 29, 2004

(30) Foreign Application Priority Data

Oct. 29, 2002 (JP) .................................... 2002-314926

(51) Int. Cl.$^7$ ............................................. G03B 27/42
(52) U.S. Cl. ............................. 355/53; 355/72; 355/76; 310/10; 310/12; 318/649
(58) Field of Search ............................. 355/53, 72, 76; 310/10, 12; 318/649

(56) References Cited

U.S. PATENT DOCUMENTS

| 6,151,100 | A | 11/2000 | Yamane et al. ............... 355/53 |
| 6,266,133 | B1 | 7/2001 | Miyajima et al. ............. 355/72 |
| 6,449,030 | B1 | 9/2002 | Kwan ........................... 355/72 |
| 6,583,859 | B2 | 6/2003 | Miyajima et al. ............. 355/72 |
| 2004/0051854 | A1 * | 3/2004 | Tanaka et al. ................. 355/53 |

FOREIGN PATENT DOCUMENTS

JP   62-88526   4/1987

* cited by examiner

Primary Examiner—D. Rutledge
(74) Attorney, Agent, or Firm—Fitzpatrick, Cella, Harper & Scinto

(57) ABSTRACT

Disclosed is a positioning system effective to cancel a moment reaction force, and it includes a movable portion and a reaction force absorbing mechanism for absorbing a propulsion reaction force to be produced by motion of the movable portion. A first distance between a reference plane and a gravity center position of the movable portion, being supported for movement along the reference plane, and a second distance between the reference plane and a gravity center position of the reaction force absorbing mechanism are made substantially equal to each other, and/or the second distance and a third distance between the reference plane and a motor movable element for propelling the movable portion along the reference plane are made substantially equal to each other.

18 Claims, 6 Drawing Sheets

POSITIONING SYSTEM AND EXPOSURE APPARATUS HAVING THE SAME

FIELD OF THE INVENTION AND RELATED ART

This invention relates to a positioning system suitably usable in high precision processing such as semiconductor lithography, for example, and an exposure apparatus having such a positioning system. In another aspect, the invention concerns a device manufacturing method using such an exposure apparatus.

Typical exposure apparatuses for the manufacture of semiconductor devices include a step-and-repeat type exposure apparatus (called a "stepper") in which a pattern of an original (e.g., a reticle or a mask) is sequentially transferred to plural exposure regions on a substrate (e.g., a wafer or a glass substrate) through a projection optical system while the substrate is moved stepwise, and a step-and-scan type exposure apparatus (called a "scanner") in which, by repeating stepwise motion and scan exposure, exposure and transfer are carried out repeatedly to plural regions on a substrate.

Particularly, the step-and-scan type apparatuses use only a portion relatively close to the optical axis of a projection optical system with the restriction by a slit, and therefore it enables higher precision and wider picture angle exposure of a fine pattern. Such exposure apparatuses generally comprise a positioning stage system (e.g., a wafer stage or a reticle stage) for moving a wafer or reticle at a high speed and then positioning the same, as disclosed in Japanese Laid-Open Patent Application No. 62-88526, for example.

SUMMARY OF THE INVENTION

Japanese Laid-Open Patent Application No. 62-88526 discloses a structure in which the driving position of an X-Y movable guide and the gravity center position of a stage are at the same level, thereby preventing yawing and pitching of the stage. However, in such a stage system, there is no reaction force absorbing mechanism for absorbing a propulsion reaction force to be produced by motion of a movable portion. Therefore, when the stage is driven, a reaction force of inertia is produced as a result of acceleration or deceleration. If it is transmitted to a base table, it causes swinging motion or vibration of the base table. Hence, the natural vibration of the mechanism system of the exposure apparatus may be excited by swinging motion or vibration of the base table to generate high frequency vibration. This is a factor that obstructs high-speed motion and high-precision positioning.

It is accordingly an object of the present invention to provide a positioning system by which vibration or swinging motion resulting from stage motion can be reduced such that high-speed and high-precision positioning can be accomplished. Also, it is an object of the present invention to provide an exposure apparatus, for example, in which such a positioning system is incorporated. Particularly, it is an object of the present invention to reduce vibration or swinging motion of a base table to be produced by a moment reaction force, resulting from motion of a stage.

In accordance with an aspect of the present invention, to achieve at least one of the objects described above, there is provided a positioning system, comprising: a movable portion supported for movement along a reference plane; a reaction force absorbing mechanism for absorbing a propulsion reaction force to be produced by motion of said movable portion; and a motor movable element for propelling said movable portion along the reference plane, wherein a first distance between the reference plane and a gravity center position of said movable portion and a second distance between the reference plane and a gravity center position of said reaction force absorbing mechanism are made substantially equal to each other and/or the second distance and a third distance between the reference plane and said motor movable element are made substantially equal to each other.

In one preferred form of this aspect of the present invention, said reaction force absorbing mechanism comprises a stator of a motor for driving said movable portion.

The reaction force absorbing mechanism may be adapted to move the reference plane.

In accordance with another aspect of the present invention, there is provided a positioning system, comprising: a movable portion supported for movement in two axial directions being substantially orthogonal to each other along a reference plane; an X movable member including said movable portion; a Y movable member including said moveable portion; a first reaction force absorbing mechanism for absorbing a propulsion reaction force to be produced by motion of said X movable member in a first movement direction; and a second reaction force absorbing mechanism for absorbing a propulsion reaction force to be produced by motion of said Y movable member in a second movement direction, wherein a first distance between the reference plane and a gravity center position of said X movable member and a second distance between the reference plane and a gravity center position of said first reaction force absorbing mechanism are made substantially equal to each other, and a third distance between the reference plane and a gravity center position of said Y movable member and a fourth distance between the reference plane and a gravity center position of said second reaction force absorbing mechanism are made substantially equal to each other.

In one preferred form of this aspect of the present invention, said X movable member includes a first beam member for transmitting, to said movable portion, a propulsion force for propelling said movable portion in a first direction, and a first motor movable element for propelling said movable portion in the first direction.

The Y movable member may include a second beam member for transmitting, to said movable portion, a propulsion force for propelling said movable portion in a second direction, and a second motor movable element for propelling said movable portion in the second direction.

The X movable member may include said movable portion, a second movable portion provided on said movable portion, a first beam member for transmitting, to said movable portion, a propulsion force for propelling said movable portion in a first direction, and a first motor movable element for propelling said movable portion in the first direction.

The Y movable member may include said movable portion, a second movable portion provided on said movable portion, a second beam member for transmitting, to said movable portion, a propulsion force for propelling said movable portion in a second direction, and a second motor movable element for propelling said movable portion in the second direction.

The second movable portion may comprise a fine-motion stage for adjusting a position and an attitude of said movable portion.

In accordance with a further aspect of the present invention, there is provided a positioning system, comprising: a movable portion supported for movement in two axial directions being substantially orthogonal to each other along a reference plane; a first guide member for guiding said movable portion in a first direction; a second guide member for guiding said movable portion in a second direction; a first reaction force absorbing mechanism for absorbing a propulsion reaction force to be produced by motion of said movable portion in a first direction; and a second reaction force absorbing mechanism for absorbing a propulsion reaction force to be produced by motion of said movable portion in a second direction, wherein a first distance between the reference plane and a gravity center position of said first guide member and a second distance between the reference plane and a gravity center position of said first reaction force absorbing mechanism are made substantially equal to each other, and a third distance between the reference plane and a gravity center position of said second guide member and a fourth distance between the reference plane and a gravity center position of said second reaction force absorbing mechanism are made substantially equal to each other.

In accordance with a yet further aspect of the present invention, there is provided a positioning system, comprising: a movable portion supported for movement in two axial directions being substantially orthogonal to each other along a reference plane; a first motor movable element for propelling said movable portion in a first direction along the reference plane; a second motor movable element for propelling said movable portion in a second direction along the reference plane; an first reaction force absorbing mechanism for absorbing a propulsion reaction force to be produced by motion of said movable portion in the first direction; and a second reaction force absorbing mechanism for absorbing a propulsion reaction force to be produced by motion of said movable portion in the second direction, wherein a first distance between the reference plane and a gravity center position of said first motor movable element and a second distance between the reference plane and a gravity center position of said first reaction force absorbing mechanism are made substantially equal to each other, and a third distance between the reference plane and a gravity center position of said second motor movable element and a fourth distance between the reference place and a gravity center position of said second reaction force absorbing mechanism are made substantially equal to each other.

In accordance with a still further aspect of the present invention, there is provided a positioning system, comprising: a movable portion supported for movement in two axial directions being substantially orthogonal to each other along a reference plane; a first guide member for guiding said movable portion in a first direction; and a first motor movable element for propelling said movable portion in a first direction along the reference plane, wherein a first distance between the reference plane and a gravity center position of said first guide member and a second distance between the reference plane and said first motor movable element are made substantially equal to each other.

In accordance with a still further aspect of the present invention, there is provided a positioning system, comprising: a movable portion supported for movement in two axial directions being substantially orthogonal to each other along a reference plane; a second guide member for guiding said movable portion in a second direction; and a second motor movable element for propelling said movable portion in a second direction along the reference plane, wherein a first distance between the reference place and a gravity center position of said second guide member and a second distance between the reference plane and said second motor movable element are made substantially equal to each other.

At least one of said first guide member and said second guide member may include a plurality of guiding elements spaced from each other with respect to a direction of the reference plane.

The first and second reaction force absorbing mechanisms may include a stator of a motor for driving said movable portion.

In accordance with another aspect of the present invention, there is provided an exposure apparatus, comprising: an original positioning system for holding an original and for moving the original to a predetermined position and positioning the same at the predetermined position; a substrate positioning system for holding a substrate and for moving the substrate to a predetermined position and positioning the same at the predetermined position; and a projection optical system for projecting a pattern of the original onto the substrate, wherein at least one of said original positioning system and said substrate positioning system comprises a positioning system as recited above.

In accordance with a yet further aspect of the present invention, there is provided a device manufacturing method, comprising the steps of: applying a photosensitive agent to a substrate; exposing the substrate by use of an exposure apparatus as recited above; and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
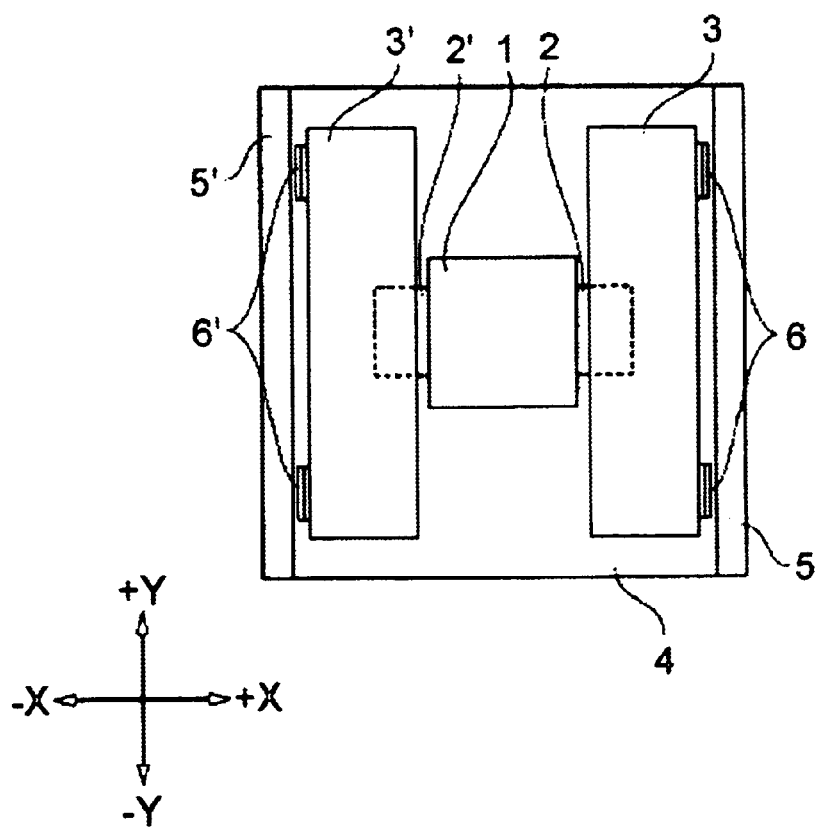
FIGS. 1A and 1B are schematic views, respectively, for explaining the structure of a positioning system according to a first embodiment of the present invention.
Figure 1B:
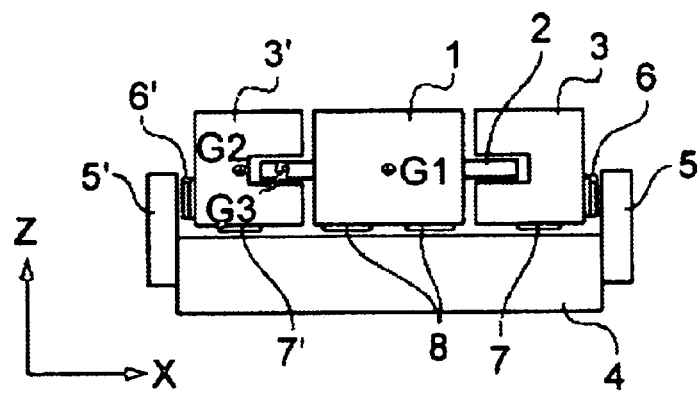

Preferred embodiments of the present invention will now be described with reference to the attached drawings.
[First Embodiment]
Structure of Positioning System:

FIGS. 1A and 1B are schematic views, respectively, for explaining the structure of a positioning system according to a first embodiment of the present invention. In the drawings, denoted at 1 is a movable table, and denoted at 2 and 2' are Y linear motor movable elements for moving the movable table 1 in a Y-axis direction. Denoted at 3 and 3' are Y linear motor stators. Denoted at 4 is a stage base (base table) having a guide surface at its top face on which a movable table 1 and the Y linear motor stators 3 and 3' and so on are mounted. Denoted at 5 and 5' are Y yawing guides for restricting yawing of the Y linear motor stators (eccentric swinging motion or run of the Y linear motor stators 3 and 3').

Denoted at 6 and 6' and 7 and 7' are static bearings adapted to float the side and bottom faces of the Y linear motor stators 3 and 3' and the bottom face of the movable table 1, respectively, by static pneumatic pressure.

The movable table 1 is supported by a static bearing 8 with respect to the stage base 4 without contact thereto as seen in FIG. 1B, and it is movable in the Y direction. Fixedly mounted at the opposite sides of the movable table 1 are the Y linear motor stators 2 and 2' for driving the moving table 1 in the Y direction. As shown in FIG. 1B, each of the Y linear motor stators 2 and 2' is moveably accommodated inside a recessed portion of the Y linear motor stator 3 or 3', with a predetermined clearance maintained therebetween.

More specifically, the Y linear motor stators 3 and 3' are supported by the static bearings 7 and 7' with respect to the stage base 4, without contact thereto, and simultaneously, it is supported by the static bearings 6 and 6' with respect to the Y yawing guides 5 and 5' without contact thereto, while the stators 3 and 3' are movable along the Y direction. Further, these Y linear motor stators 3 and 3' have a predetermined mass so that they can function as a reaction force counter, to be described later.

The Y linear motor movable element 2 and 2' are connected to the movable table 1, such that, with the motion of the movable elements, the movable table 1 moves in the Y direction. At this time, a reaction force of a driving force (drive reaction force) is produced by the motion of the movable table 1, and it is applied to the Y linear motor stators 3 and 3'. Since the Y linear motor stators 3 are supported for movement upon the stage base 4, with the driving reaction force, the Y linear motor stators move along the stage base 4 in a direction opposite to the movement direction of the movable table 1.

Hence, through the movement of the Y linear motor stators 3 and 3' along the stage base 4, transmission of the drive reaction force to the stage base 4 can be prevented effectively. Thus, the Y linear motor stators 3 and 3' function as a reaction force counter.

In this embodiment, if the movable table 1 moves in a positive Y direction, for example, the Y linear motor stators 3 and 3' receive a drive reaction force in a negative Y direction, such that, with this negative-direction force as a driving force, the stators 3 and 3' are moved in the negative Y direction.

The positioning system may be provided with one or more laser interferometers (not shown) for positioning the movable table with respect to a predetermined position, and, through a position control based on positional information obtained by the laser interferometers, the movable table 1 may be positioned. Similarly, the position of the stators may be measured by use of unshown interferometers thereby to position the Y linear motor stators 3 and 3' which are a reaction force counter moving along a plane.

With the structure shown in FIGS. 1A and 1B, the reaction force during acceleration and deceleration of the movement of the movable table 1 is received by the Y linear motor stators 3 and 3' (serving as a reaction force counter), and through the motion of the Y linear motor stators 3 and 3', the drive reaction force is converted into kinetic energy of the stators 3 and 3'. As a result of this, vibration of the stage base 4 due to the drive reaction force resulting from the motion of the movable table 1 can be prevented effectively. In addition, transmission of vibration to the floor surface where the apparatus having the positioning system incorporated therein is mounted can be prevented effectively. Therefore, the positioning system excludes factors that cause external disturbance (vibration source) not only with respect to the machine in which the system itself is incorporated but also with respect to another machine.

Further, since the Y linear motor stators 3 and 3' move along the stage base 4 in accordance with acceleration of the movable table 1, any offset load during the motion of the movable table 1 can be made small. As a result, for holding and positioning a wafer, for example, uniform position and attitude can be accomplished throughout the entire movement range of the movable table. For wafer exposure, the overlay precision is improved significantly. In accordance with the present embodiment, since the Y linear motor stators 3 and 3' move in a direction opposite to the movement direction of the movable table 1, any change in gravity center position of the whole structure, including the movable table 1 and the stators 3 and 3', can be suppressed significantly. Therefore, even with the motion of the movable table 1, the load balance upon the stage base 4 does not change largely and, as a result of it, the offset load due to the motion of the movable table 1 can be made small.

Furthermore, in accordance with the present embodiment, the linear motor stators 3 and 3' are provided independently of each other. As a result, even if the forces applied to the Y linear motor movable element 2 and 2' are different, the reaction force can be cancelled through separate movements of the Y linear motor stators 3 and 3'. For example, if the movable table 1 is moved rotationally in the θ direction or where a certain object placed on the movable table 1 has an offset load with respect to the X direction, outputs of the Y linear motor movable elements 2 and 2' may be different. Even in such a case, however, since the Y linear motor stators 3 and 3' can be moved separately, effective cancellation of the drive reaction force is accomplished.

With the structure such as shown in FIGS. 1A and 1B, the drive reaction force to be produced by acceleration or deceleration of the movable table 1 can be converted into kinetic energies through the movements of the Y linear motor stators 3 and 3' in opposite directions, and thus it can be absorbed thereby. In this manner, swinging motion or vibration of the base table due to the drive reaction force can be avoided or suppressed effectively.

Absorption of Moment about Gravity Center:

If, however, there is misregistration between the gravity center level (height) of the movable table 1 and the gravity center level of the stator Y linear motor, it is necessary to take into account the moment about the gravity center of the structure, including the stage base. More specifically, the moment about the X-axis to be applied to the apparatus as a whole due to the motion of the movable table 1 and the moment about the X-axis to be applied to the apparatus as a whole due to the movement of the Y linear motor stators 2 and 2' do not balance with each other, such that a moment corresponding to the difference therebetween is applied to the stage base consequently.

Figure 4:
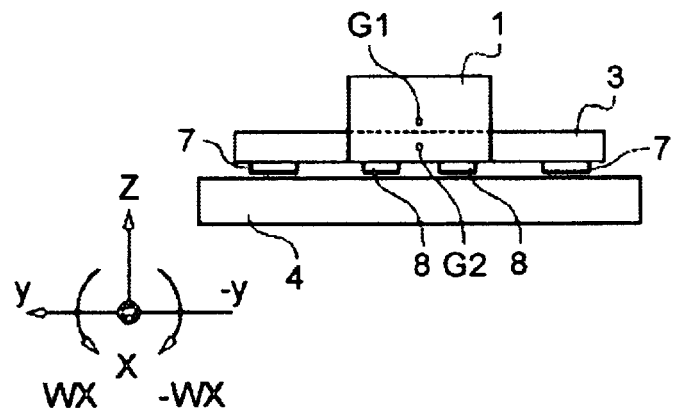
FIG. 4 is a schematic view for explaining a moment reaction force resulting from misregistration of a gravity center position.

For example, as shown in FIG. 4, when the gravity center position G1 of the movable table 1 (the height in the Z direction, taking the top face of the stage base 4 as a reference) is higher than the gravity center position G2 of the Y linear motor stators 3 and 3', if the movable table 1 is moved in the positive Y direction (leftward in FIG. 4), a clockwise moment in the negative ωx direction (moment reaction force) is applied to the stage base as a result of it.

On the other hand, since the Y linear motor stators 3 and 3' move in the negative Y direction in response to the application of a drive reaction force in the negative Y direction thereto, as a results, a counterclockwise moment in the positive ωx direction (moment reaction force) is applied to the stage base 4.

Obviously, if the applied forces are equal to each other, the former moment having a higher gravity center is larger. As a consequence, therefore, the moment in the negative ωx direction is dominantly applied to the stage base. When the gravity center positions are different, as described above, the moment reaction force could not be cancelled with the structure of the Y linear motor stators 3 and 3'. As a result, the vibration of the stage base 4 is accelerated by the moment reaction force, while vibration of the floor where the apparatus is mounted is excited. Hence, vibration of the machine itself as well as vibration of another machine may be excited.

In the structure of the positioning system according to the present embodiment, as shown in FIGS. 1A and 1B, in order to extinguish the adverse influence of the moment reaction force such as described with reference to FIG. 4, the gravity center position of the Y linear motor stators 3 and 3' and the gravity center position (G1) of the whole moving structure, including the movable table 1 and the Y linear motor movable elements 2 and 2', are set at the same level (height). With this arrangement, the drive reaction force to be produced by the motion of the movable table 1, as well as the moment reaction force to be applied to the stage base, can be cancelled completely.

Line of Action of the Linear Motor:

In the present embodiment, as shown in FIG. 1B, preferably, the height (G3) of the line action of the force to be applied to the Y linear motor movable elements is set at the same level as the height (G2) of the gravity center position of the Y linear motor stators 3 and 3'. With this arrangement, the Y linear motor propulsion force can be applied to the gravity center height of the Y linear motor stators 3 and 3'. Thus, regarding the operation of the Y linear motor stators 3 and 3' as a single unit, it does not produce a moment about the gravity center thereof. Hence, there is an advantage that excitation of vibration to the stage base 4 can be avoided. Simultaneously, the Y linear motor propulsion force acts on the gravity center height (G1) of the movable table 1 or on the gravity center height of the whole movement structure, including the movable table 1 and the Y linear motor movable elements 2 and 2'. Therefore, regarding the operation of the movable table 1 or the operation of only the whole movement structure including the movable table 1 and the Y linear motor movable elements 2 and 2', it does not produce a moment about the gravity center thereof. Hence, excitation of vibration to the stage base can be prevented effectively.

With the structure described above, the drive reaction force in the Y-axis direction, which is the movement direction of the movable table 1, is absorbed by the motion of the stators. Further, the gravity center height (G1) of the movable table 1, the gravity center height (G2) of the linear motor stators 3 and 3', and the height (G3) of the line of action of the linear motors are registered with each other, by which production of a moment reaction force about the Z axis can be prevented. As a result, a high-speed and high-precision positioning system in which excitation of vibration or swinging motion of the stage base is prevented, is accomplished.

While the present invention has been described with reference to an example wherein the guide surface of the movable table 1 and the guide surface of the Y linear motor stators 3 and 3' are coplanar (i.e., stage base 4), they may be defined upon different parallel planes, and substantially the same advantageous effects are attainable on that occasion.

[Second Embodiment]

Figure 2A:
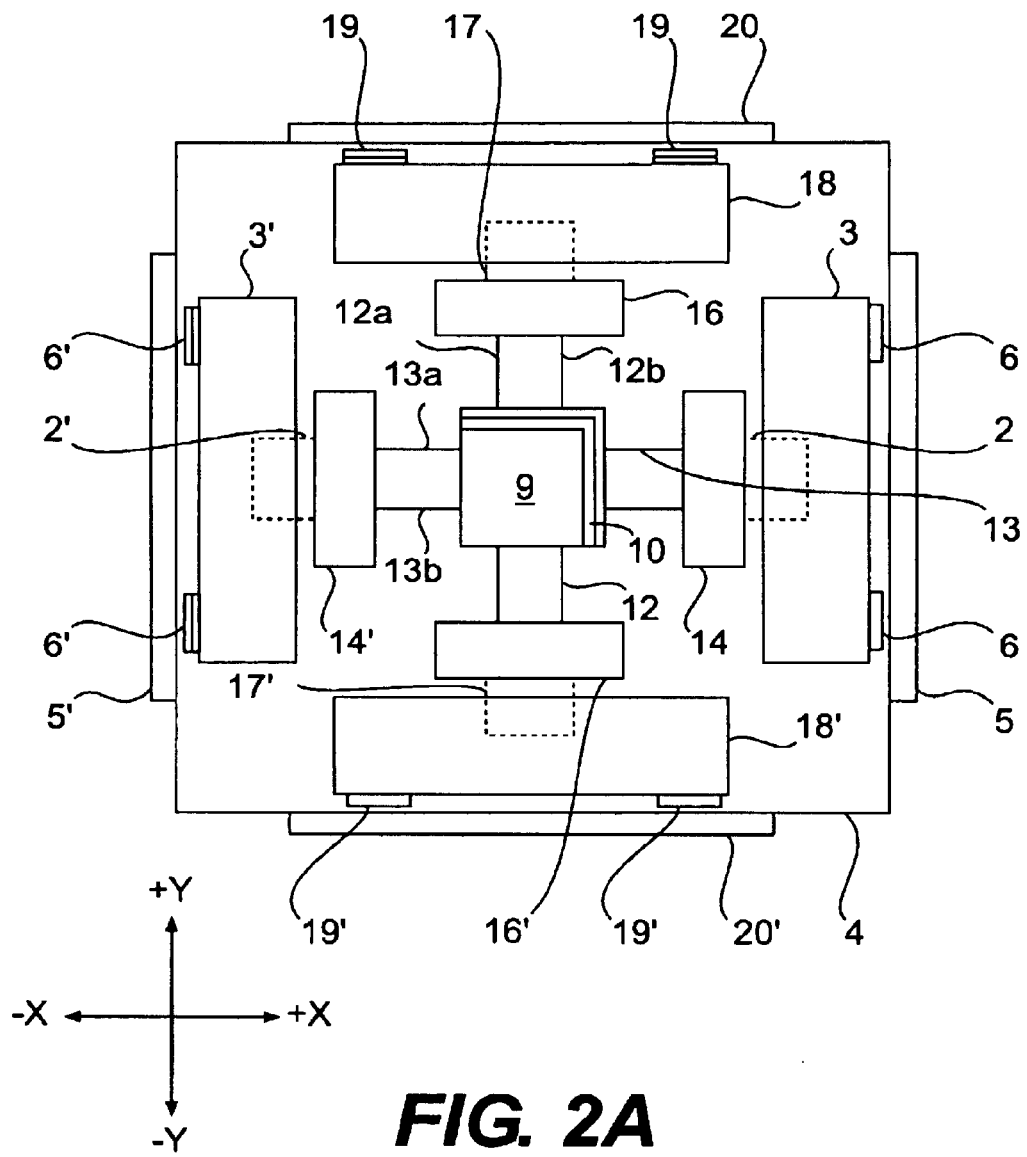
FIGS. 2A, 2B and 2C are schematic views, respectively, for explaining the structure of a positioning system according to a second embodiment of the present invention.
Figure 2B:
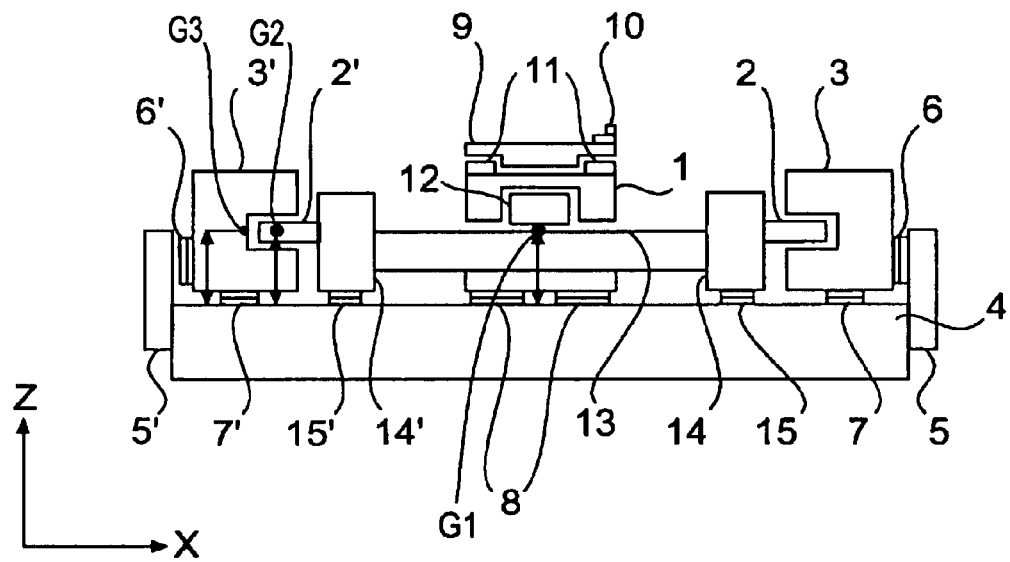
Figure 2C:
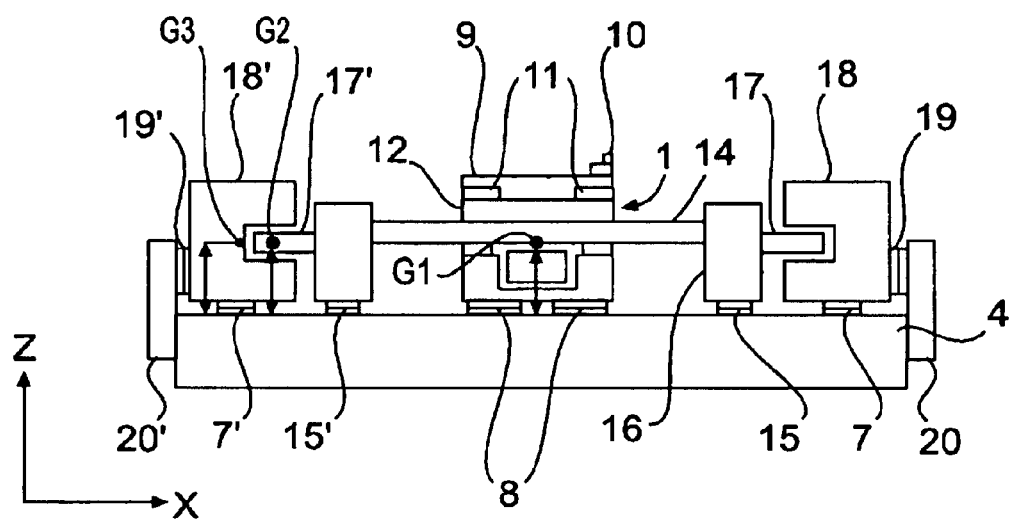

FIGS. 2A, 2B and 2C illustrate the structure of a positioning system according to a second embodiment of the present invention. FIG. 2A is a plan view of the positioning system, FIG. 2B is a front view and FIG. 2C is a right-side view thereof. In these drawings, those elements corresponding to the components of FIGS. 1A and 1B are denoted by like numerals. Denoted at 9 is a fine-motion table which is mounted on a movable table 1 and which can operate to perform upward and downward motion and tilt motion. Denoted at 10 is a reflection mirror mounted on the fine-motion table 9. Denoted at 11 is a plurality of fine-motion actuators which are provided on the movable table 1 and which function to perform upward and downward motion and tilt motion of the fine-motion table.

Denoted at 12 is an X beam (beam member) for moving the moving table 1 in the X-axis direction. Denoted at 13 is a Y beam for moving the movable table 1 in the Y direction. Formed on the opposite side faces 12a and 12b of the X beam 12 are Y guide surfaces for guiding the motion of the movable table 1 in the Y direction. Also, formed on the opposite side faces 13a and 13b of the Y beam 13 are X guide surfaces for guiding the motion of the movable table 1 in the X direction. There are a plurality of static bearings (not shown), which are provided between the movable table 1 and the Y guide surfaces, formed on the X beam 12, and the X guide surfaces, formed on the Y beam 13. Hence, non-contact force transmission and straight guiding operation are carried out thereby.

Denoted at 14 and 14' are Y sliders disposed at the opposite ends of the Y beam 13. Denoted at 15 and 15' are static bearings provided at the bottom faces of the Y sliders. Similarly, denoted at 16 and 16' are X sliders disposed at the opposite ends of the X beam 12. There are similar static pads disposed at the bottom faces of the X sliders, while not shown in the drawings.

Denoted at 17 and 17' are X linear motor movable elements for moving the X beam 12 in the X direction. Denoted at 18 and 18' are X linear motor stators. Denoted at 20 and 20' are X yaw guides for restricting yawing motion of the X linear motor stators 18 and 18'. Also, denoted at 19 and 19' are static bearings for floating the side faces of the X linear motor stators 18 and 18' through static pneumatic pressure. Similar static bearings are provided at the bottom faces, while not shown in the drawing.

The movable table 1 is supported by the static bearings 8 with respect to the stage base 4 without contact thereto, as shown in FIG. 2B, and it can be moved in the X and Y directions. The movable table 1 has the X beam 12 and Y beam 13 extending therethrough, substantially orthogonally to each other. There are static bearings (not shown) at the opposed faces of the Y guide surfaces of the X beam 12 and the X guide surface of the Y beam 13, of the movable table 12, which bearings function to perform transmission of forces and various drive-guiding operations. As a result, the movable table 1 can always be positioned at the point of intersection between the X and Y beams.

The X sliders 16 and 16' and the Y sliders 14 and 14' are coupled to the opposite ends of the X beam 12 and the Y beam 13, respectively. Also, there are static bearings mounted at the bottom faces of the sliders. As a result, a combined structure of the X beam 12 and the X sliders 16 and 16' is movable in the X direction, and a combined structure of the Y beam 13 and the Y sliders 14 and 14' are movable in the Y direction as seen in FIG. 2B.

The X linear motor movable elements 17 and 17' and the Y linear motor movable elements 2 and 2' are coupled to the X sliders 16 and 16' and the Y sliders 14 and 14', respectively, such that these sliders can be driven by propulsion forces produced by these linear motors, respectively. The X linear motor movable elements 17 and 17' and the Y linear motor movable elements have the X linear motor stators 18 and 18' and the Y linear motor stators 3 and 3' disposed opposed to each other. The linear motor structures in the respective movement directions are provided, in the manner described above.

Here, the X linear motor stators 18 and 18' and the Y linear motor stators 3 and 3' are supported by the static bearings 7 and 7' (those at the X linear motor side are unshown) with respect to the stage base 4 without contact thereto. Simultaneously, they are supported by static bearings 19, 19' and 6 and 6' with respect to the X yawing guides 20 and 20' and Y yawing guides 5 and 5', without contact thereto. Thus, they are movable along the X and Y directions.

Absorption of a Drive Force:

The X linear motor stators 18 and 18' and the Y linear motor stators 3 and 3' have predetermined masses, respectively, and they serve as a reaction force counter, like the first embodiment. The X linear motor movable elements 17 and 17' and the Y linear motor movable elements 2 and 2' are connected to the X sliders 16 and 16' and the Y sliders 14 and 14', respectively, and they are movable in the X and Y direction, respectively. In turn, the X sliders 16 and 16' and the Y sliders 14 and 14' are connected to the X beam 12 and the Y beam 13, respectively. Thus, through the motion of the beams in the X and Y directions, the movable table 1 placed at the intersection of the beams is driven in the X and Y directions.

When the movable table 1 is driven in the X or Y direction in response to the propulsion force of a corresponding linear motor, a drive reaction force which acts by the motion of the movable table 1 in the X or Y direction is applied to the X linear motor stators 18 and 18' or the Y linear motor stators 3 and 3'.

With this drive reaction force, the X linear motor stators 18 and 18' or the Y linear motor stators 3 and 3' can move along the stage base 4 surface, in the X or Y direction, which is opposite to the movement direction of the movable table 1. Through the motion of the X linear motor stators 18 and 18' and the Y linear motor stators 3 and 3' in the X and Y directions along the stage base 4 surface, the drive reaction force is converted into kinetic energies of the stators, such that the drive reaction force can be cancelled thereby. Therefore, transmission of the drive reaction force to the stage base 4 can be prevented effectively, and so the linear motor stators 3 and 3' and 18 and 18' can serve as a reaction force counter.

If, for example, the movable table 1 is moved in the positive X direction, the X linear motor stators 18 and 18' move in the negative X direction in response to application of the drive reaction force thereto in the negative X direction. If the movable table 1 moves in the positive Y direction, the Y linear motor stators 3 and 3' are moved in the negative Y direction in response to application of the drive reaction force thereto in the negative Y direction.

Absorption of Moment about Gravity Center:

However, the influence of moment due to misregistration of a gravity center height of the whole structure, including a movable table and a combination of it, for example, as has been described with reference to the first embodiment, is similarly a problem to be considered. For example, when the movable table 1 moves in the X direction, if the general gravity center height of the whole movement structure (hereinafter, X-direction movement structure), including the movable table 1, the fine-motion table 9, the reflection mirror 10, the fine-motion actuators 11, the X beam 12, the X sliders 16 and 16', and the X linear motor movable elements 17 and 17', is not registered with the gravity center height of the X linear motor stators 18 and 18', the moment reaction force about the Y axis cannot be cancelled, As a result, vibration of the stage base 4 is accelerated by the moment reaction force about the Y axis and, finally, vibration of the floor where the machine is mounted may be excited. This leads to factors (vibration source) for causing external disturbance to the machine itself and also to another machine.

Similarly, when the table is moved in the Y direction, if the general gravity center height of the whole movement structure (hereinafter, gravity Y-direction movement structure), including the movable table 1, the fine-motion table 9, the reflection mirror 10, the fine-motion actuators 11, the Y beam 13, the Y sliders 14 and 14', and the Y linear motor movable elements 2 and 2', is not registered with the gravity center height of the Y linear motor stators 18 and 18', the moment reaction force about the X axis cannot be cancelled and vibration of the stage base 4 is accelerated thereby.

In accordance with the present embodiment, in order to cancel the influence of the moment reaction force such as described above, the gravity center height of the X-direction movement structure and the gravity center height of the X linear motor stators 18 and 18' are made substantially at the same level. Also, the gravity center height of the Y-direction movement structure and the gravity center height of the Y linear motor stators 18 and 18' are made substantially at the same level. With this arrangement, the drive reaction force to be produced by the motion of the movable table 1 as well as the moment reaction force to be applied to the stage base 4 can be cancelled completely.

Furthermore, in this embodiment, preferably, the gravity center height of a movement structure (hereinafter, unit X-axis movement structure), including the X beam 12, the X sliders 16 and 16', and the X linear motor movable elements 17 and 17', and the gravity center height of a movement structure (hereinafter, unit Y-axis movement structure), including the Y beam 13, the Y sliders 14 and 14', and the Y linear motor movable elements 2 and 2', are made at the same level. Also, the gravity center heights of the X-linear motor stators 18 and 18' and of the Y linear motor stators 3 and 3' are preferably made at the same level. With this arrangement, even with respect to the action-reaction interrelationship between the linear motor stators and unit X-axis and Y-axis movement structure, there does not occur a moment about the X axis or Y axis with respect to the stage base 4, such that excitation of vibration of the stage base can be avoided.

Line of Action of Linear Motor;

Further, in the present embodiment, a shown in FIGS. 1A and 1B, preferably, the line of action of the force to be applied to the linear motor movable elements is made at the same level as the gravity center height of the linear motor stators. With this structure, the linear motor propulsion force acts at the gravity center height of the linear motor stators. Thus, even regarding the operation of the X linear motor stators 18 and 18' and the Y linear motor stators 3 and 3' as a unit, it does not produce a moment about the gravity center thereof. As a result, excitation of vibration to the stage base 4 can be avoided.

In accordance with the structure described above, a stage system in which not only a reaction force in the X-axis or Y-axis direction, which is the movement direction of the movable table 1, but also a moment in the X-axis, Y-axis or Z-axis direction, are never produced to the stage base, can be accomplished, as a consequence.

In the structure described above, the drive reaction force to be produced by the motion of the movable table 1 is absorbed by the movement of the stators. Additionally, the gravity center height of the movement structure, the gravity center height of the linear motor stators, and the height of the linear motor action line (G3) are made at the same level. This effectively prevents production of a moment reaction force about the Z axis. Thus, a positioning system in which swinging motion or vibration of the stage base 4 is not excited, can be accomplished.

Although the present embodiment has been described with reference to an example wherein the guide surface of the movable table 1 and the guide surface of the Y linear motor stators 3 and 3' are coplanar (i.e., the stage base 4), they may be defined upon different parallel planes and substantially the same advantageous effects are attainable on that occasion.

[Third Embodiment]

Figure 3:
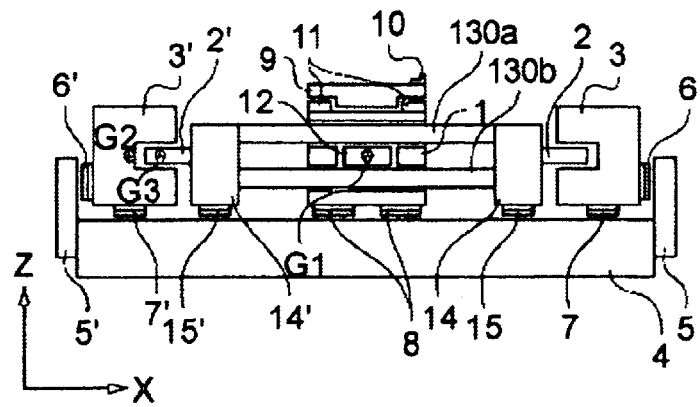
FIG. 3 is a schematic view for explaining the structure of a positioning system according to a third embodiment of the present invention.

FIG. 3 is a front view for explaining the structure of a positioning system according to a third embodiment of the present invention. The top view of the same may be similar to the top view of FIG. 2A. In FIG. 3, those components corresponding to the elements of FIGS. 1 and 2 are denoted by like numerals. This embodiment differs from the second embodiment in that the Y beam comprises two, that is, upper and lower beams. More specifically, denoted at 130a and 130b are Y beams having two, upper and lower beams. X guide surfaces for guiding the motion of the movable table 1 in the X direction are defined at the opposite side faces of these Y beams, respectively. There are static bearings (not shown) disposed between the movable table 1 and these guide surfaces, such that non-contact and straight motion guiding operation is carried out.

In this embodiment, the X beam 12 comprises a single beam while the Y beam comprises two beams 130a and 130b disposed in the vertical direction. This facilitates easy designing for providing a structure in which the gravity center height of a unit X-axis movement structure, including the X beam 12, the X sliders 16 and 16' and the X linear motor movable elements 17 and 17', and the gravity center height of the unit Y-axis movement structure, including the Y beams 130a and 130b, and Y sliders 14 and 14', and the Y linear motor movable elements 2 and 2', are made substantially at the same level.

Alternatively, since, in this embodiment the X beam 12 comprises a single beam, while the Y beam comprises two beams 130a and 130b disposed in the vertical direction, the gravity center height of the Y guide surfaces formed at the side faces of the X beam 12 and the gravity center height of the X guide surfaces defined at the side faces of the Y beams 130a and 130b, can be made at the same level. The gravity center height of these X and Y guide surfaces corresponds to the height of the line of action of the force as the X-direction and Y-direction driving forces of the X beam 12 and Y beams 130a and 130b are transmitted to the movable table 1. Any difference between the gravity center height of the movable table 1 and the gravity center height of the guide surfaces corresponds to the moment to be applied to the movable table 1.

Hence, since the gravity center height of the Y guide surfaces 12a and 12b defined at the side faces of the X beam 12 is at the same level as the gravity center height of the X guide surfaces formed at the side faces of the Y beam 130a and 130b, the moments to be applied by the X-direction motion and Y-direction motion of the movable table 1 are equal to each other. As a result, dynamic actions such as vibration convergence time or largest pitching amount can be made approximately equal to each other.

Further, the gravity center height of the X guide surfaces and Y guide surfaces is made substantially at the same level as the gravity center height of the whole movement structure, including the movable table 1, the fine-motion table 9, the reflection mirror 11, and the fine-motion actuators 11, and, in this arrangement, the transmission force of the propulsion force of each linear motor can act on the gravity center of the whole movement structure. As a result, a moment about the gravity center is not produced, and excitation of vibration to the stage base 1 can be avoided.

Preferably, the gravity center height of the X movement structure, including the X beam 12, the X sliders 16 and 16' and the X linear motor movable elements 17 and 17', and the gravity center height of the Y movement structure, including the Y beams 130a and 130b, the Y sliders 14 and 14', and the Y linear motor movable elements 2 and 2', as well as the lines of action of the propulsion forces of the linear motor stators, are made at the same level. With this arrangement, even regarding the drive of a unit component as the X moment structure or Y movement structure, a moment about its gravity center is not at all produced. Consequently, excitation of vibration to the stage base 4 can be avoided effectively.

Although the present embodiment has been described with reference to an example wherein the Y beam comprises two, upper and lower beams, while the X beam comprises a single beam, in reverse, the X beam may comprise two, upper and lower beams and the Y beam may comprise a single beam. Substantially the same advantageous effects are obtainable on that occasion. Further, the number of beams is not limited to two, and three or more beams may be used. Also, the other beam is not limited to a single beam, such that plural beams may be used for both of the X and Y beams. One of the X and Y beams may comprise beams of an even number, while the other may comprise beams of an odd number, for example, a combination of two beams and three beams in different directions.

[Fourth Embodiment: Exposure Apparatus]

Figure 5:
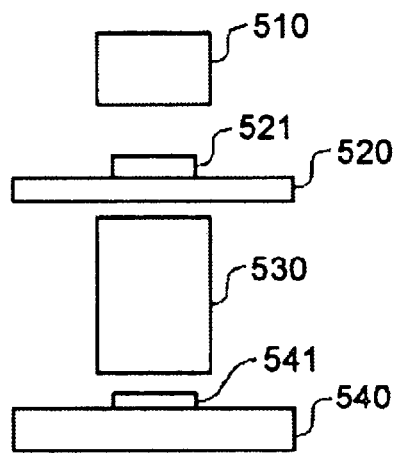
FIG. 5 is a schematic view for explaining a general structure of an exposure apparatus to which a positioning system according to an embodiment of the present invention is incorporated.

FIG. 5 is a schematic view of a general structure of an exposure apparatus in which a positioning system such as described above is incorporated as a substrate stage system and/or an original stage system. In this exposure apparatus, an original (reticle or mask) 521 held by an original stage 520 is illuminated by an illumination optical system 510, and a pattern of the original 521 is projected by a projection optical system 530 onto a substrate (wafer) 541 placed on a substrate stage (wafer stage) 540, whereby the substrate 541 is exposed with the pattern. Here, each of the stages 520 and 540 comprises a positioning system as has been described with reference to any one of the first to third embodiments.

In accordance with the exposure apparatus having a positioning system according to any of the preceding embodiments, a drive reaction force to be produced during acceleration or deceleration of the movable table can be converted into kinetic energies through the motion of the motor stators in an opposite direction and it can be absorbed thereby. Simultaneously, with the structure in which the gravity center positions of various movement components are held approximately at the same level, vibration to be applied to the stage base due to the moment reaction force can be cancelled effectively, As a result, unwanted swinging motion or vibration of the base table attributable to the drive reaction force or moment can be reduced and suppressed, such that high-speed and high-precision positioning can be accomplished. Hence, with the use of such a high-speed and high-precision positioning system, the throughput of the exposure apparatus can be improved significantly.

[Fifth Embodiment: Semiconductor Device Manufacturing Processes]

Next, an embodiment of a semiconductor device manufacturing method uses an exposure apparatus as described above, will be explained.

Figure 6:
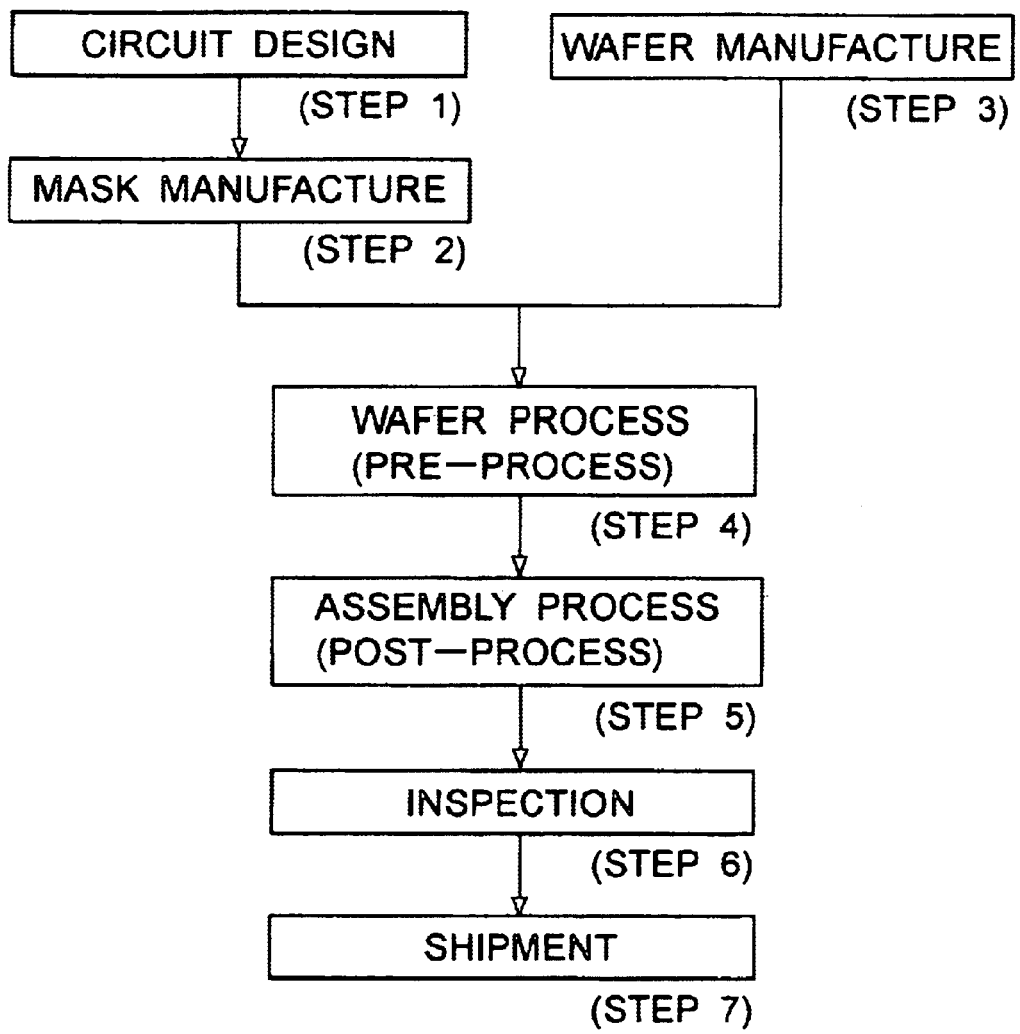
FIG. 6 is a flow chart for explaining a general procedure for the manufacture of semiconductor devices.

FIG. 6 is a flow chart for explaining a general procedure for manufacturing various microdevices such as semiconductor devices, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer, in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With the processes, semiconductor devices are produces, and they are shipped (step 7).

Figure 7:
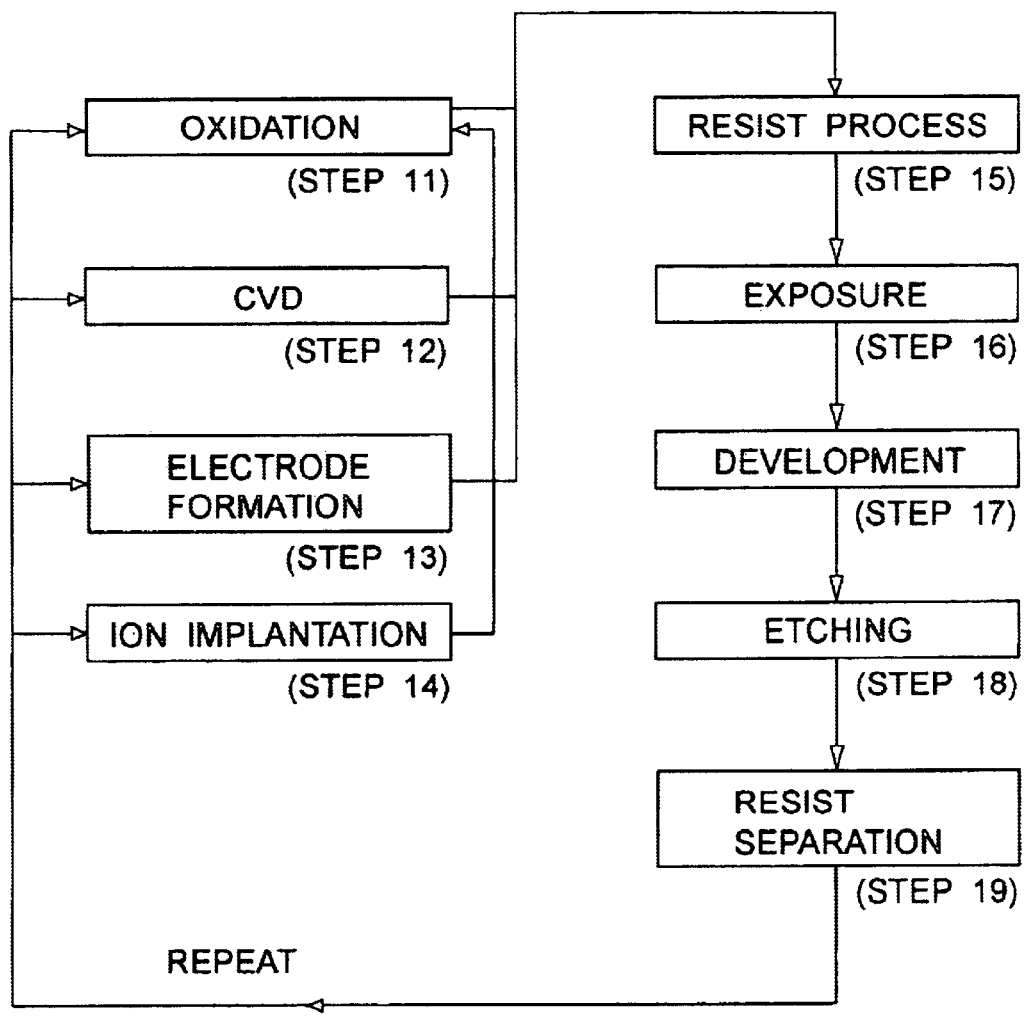
FIG. 7 is a flow chart for explaining details of a wafer process, included in the flow chart of FIG. 6.

FIG. 7 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A positioning system, comprising:
   a stage base having a reference plane defined on its upper face;
   a movable portion supported for movement along the reference plane;
   a reaction force absorbing mechanism for absorbing a propulsion reaction force to be produced by motion of said movable portion; and
   a motor movable element for propelling said movable portion along the reference plane,
   wherein a first distance between the reference plane and a gravity center position of said movable portion and a second distance between the reference plane and a gravity center position of said reaction force absorbing mechanism are made substantially equal to each other and/or the second distance and a third distance between the reference plane and a line of action of a force applied to said motor movable element are made substantially equal to each other.

2. A positioning system according to claim 1, wherein said reaction force absorbing mechanism comprises a stator of a motor for driving said movable portion.

3. A positioning system according to claim 1, wherein said reaction force absorbing mechanism is adapted to move the reference plane.

4. An exposure apparatus, comprising:
   an original positioning system for holding an original and for moving the original to a predetermined position and positioning the same at the predetermined position;
   a substrate positioning system for holding a substrate and for moving the substrate to a predetermined position and positioning the same at the predetermined position; and
   a projection optical system for projecting a pattern of the original onto the substrate,
   wherein at least one of said original positioning system and said substrate positioning system comprises a positioning system as recited in claim 1.

5. A device manufacturing method, comprising the steps of:
   applying a photosensitive agent to a substrate;
   exposing the substrate by use of an exposure apparatus as recited in claim 4, and developing the exposed substrate.

6. A positioning system, comprising:
   a movable portion supported for movement in two axial directions being substantially orthogonal to each other along a reference plane;
   an X movable member including said movable portion;
   a Y movable member including said movable portion;
   a first reaction force absorbing mechanism for absorbing a propulsion reaction force to be produced by motion of said X movable member in a first movement direction; and
   a second reaction force absorbing mechanism for absorbing a propulsion reaction force to be produce by motion of said Y movable member in a second movement direction,
   wherein a first distance between the reference plane and a gravity center position of said X movable member and a second distance between the reference plane and a gravity center position of said first reaction force absorbing mechanism are made substantially equal to each other, and a third distance between the reference plane and a gravity center position of said Y movable member and a fourth distance between the reference plane and a gravity center position of said second reaction force absorbing mechanism are made substantially equal to each other.

7. A positioning system according to claim 6, wherein said X movable member includes a first beam member for transmitting, to said movable portion, a propulsion force for propelling said movable portion in a first direction, and a first motor movable element for propelling said movable portion in the first direction.

8. A positioning system according to claim 6, wherein said Y movable member includes a second beam member for transmitting, to said movable portion, a propulsion force for propelling said movable portion in a second direction, and a second motor movable element for propelling said movable portion in the second direction.

9. A positioning system according to claim 6, wherein said X movable member includes said movable portion, a second movable portion provided on said movable portion, a first beam member for transmitting, to said movable portion, a propulsion force for propelling said movable portion in a first direction, and a first motor movable element for propelling said movable portion in the first direction.

10. A positioning system according to claim 9, wherein said second movable portion comprises a fine-motion stage for adjusting a position and an attitude of said movable portion.

11. A positioning system according to claim 6, wherein said Y movable member includes said movable portion, a second movable portion provided on said movable portion, a second beam member for transmitting, to said movable portion, a propulsion force for propelling said movable portion in a second direction, and a second motor movable element for propelling said movable portion in the second direction.

12. A positioning system according to claim 11, wherein said second movable portion comprises a fine-motion stage for adjusting a position and an attitude of said movable portion.

13. A positioning system, comprising:
a movable portion supported for movement in two axial directions being substantially orthogonal to each other along a reference plane;
a first guide member for guiding said movable portion in a first direction;
a second guide member for guiding said movable portion in a second direction;
a first reaction force absorbing mechanism for absorbing a propulsion reaction force to be produced by motion of said movable portion in a first direction; and
a second reaction force absorbing mechanism for absorbing a propulsion reaction force to be produced by motion of said movable portion in a second direction,
wherein a first distance between the reference plane and a gravity center position of said first guide member and a second distance between the reference plane and a gravity center position of said first reaction force absorbing mechanism are made substantially equal to each other, and a third distance between the reference plane and a gravity center position of said second guide member and a fourth distance between the reference plane and a gravity center position of said second reaction force absorbing mechanism are made substantially equal to each other.

14. A positioning system according to claim 13, wherein at least one of said first guide member and said second guide member includes a plurality of guiding elements spaced from each other with respect to a direction of the reference plane.

15. A positioning system according to claim 13, wherein said first and second reaction force absorbing mechanisms include a stator of a motor for driving said movable portion.

16. A positioning system, comprising:
a movable portion supported for movement in two axial direction being substantially orthogonal to each other along a reference plane;
a first motor movable element for propelling said movable portion in a first direction along the reference plane;
a second motor movable element for propelling said movable portion in a second direction along the reference plane;
a first reaction force absorbing mechanism for absorbing a propulsion reaction force to be produced by motion of said movable portion in the first direction; and
a second reaction force absorbing mechanism for absorbing a propulsion reaction force to be produced by motion of said movable portion in the second direction,
wherein a first distance between the reference plane and a line of action of a force applied to said first motor movable element and a second distance between the reference plane and a gravity center position of said first react absorbing mechanism are made substantially equal to each other, and a third distance between the reference plane and a line of action of a force applied to said second motor movable element and a fourth distance between the reference plane and a gravity center position of said second reaction force absorbing mechanism are made substantially equal to each other.

17. A positioning system according to claim 16, wherein said first and second reaction force absorbing mechanisms include a stator of a motor for driving said movable portion.

18. A positioning system, comprising:
a movable portion supported for movement in two axial directions being substantially orthogonal to each other along a reference plane;
a guide member for guiding said movable portion in a predetermined direction; and
a motor movable element for propelling said movable portion in the predetermined direction along the reference plane,
wherein a first distance between the reference plane and a gravity center position of said guide member and a second distance between the reference plane and a line of action of a force applied to said motor movable element are made substantially equal to each other.

* * * * *

UNITED STATES PATENT AND TRADEMARK OFFICE
CERTIFICATE OF CORRECTION

PATENT NO. : 6,965,426 B2 Page 1 of 1
APPLICATION NO. : 10/694083
DATED : November 15, 2005
INVENTOR(S) : Tsuneo Takashima It is certified that error appears in the above-identified patent and that said Letters Patent is hereby corrected as shown below:

Column 3,
Line 40, "place" should read -- plane --.

Column 7,
Line 6, "results," should read -- result, --.
Line 35, "line" should read -- line of --.

Column 8,
Line 1, "invention" should read -- embodiment --.

Column 10,
Line 12, "cancelled," should read -- cancelled. --.
Line 59, "Motor;" should read -- Motor: --.
Line 60, "a" should read -- as --.

Column 13,
Line 31, "produces," should read -- produced --.

Column 14,
Line 36, "4, and developing he exposed sub-" should read -- 4; and --.
Line 37, change "strate." to read -- developing the exposed substrate. -- and begin a new paragraph with -- developing --.

Column 16,
Line 11, "direction" should read -- directions --.
Line 30, "react" should read -- reaction force --.

Signed and Sealed this

Twenty-seventh Day of June, 2006

JON W. DUDAS
*Director of the United States Patent and Trademark Office*